United States Patent
Sumi

(10) Patent No.: US 8,277,031 B2
(45) Date of Patent: Oct. 2, 2012

(54) LIQUID-EJECTING HEAD, LIQUID-EJECTING APPARATUS, AND ACTUATOR

(75) Inventor: Koji Sumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 242 days.

(21) Appl. No.: 12/754,675

(22) Filed: Apr. 6, 2010

(65) Prior Publication Data

US 2010/0253750 A1 Oct. 7, 2010

(30) Foreign Application Priority Data

Apr. 7, 2009 (JP) ................................. 2009-093472

(51) Int. Cl.
*B41J 2/045* (2006.01)
(52) U.S. Cl. ............................... 347/71; 347/68; 347/72
(58) Field of Classification Search .............. 347/68–72; 310/311, 330; 29/25.35; 252/62.9
See application file for complete search history.

(56) References Cited

U.S. PATENT DOCUMENTS 6,198,208 B1 *  3/2001  Yano et al. .................... 310/358
7,521,845 B2     4/2009  Ifuku et al.
2008/0018716 A1* 1/2008  Noguchi et al. ................. 347/71
2010/0025618 A1* 2/2010  Watanabe et al. ......... 252/62.9 R

FOREIGN PATENT DOCUMENTS

| JP | 2002-299714 | 10/2002 |
|----|-------------|---------|
| JP | 2005-119166 | 5/2005  |
| JP | 2007-088446 | 4/2007  |

* cited by examiner

*Primary Examiner* — Matthew Luu
*Assistant Examiner* — Henok Legesse
(74) *Attorney, Agent, or Firm* — Workman Nydegger

(57) ABSTRACT

A liquid-ejecting head includes a flow-passage-forming substrate that includes a pressure-generating chamber, the pressure-generating chamber being in communication with a nozzle through which droplets are ejected, and a piezoelectric element disposed on the flow-passage-forming substrate, the piezoelectric element altering the internal pressure of the pressure-generating chamber. The piezoelectric element includes a piezoelectric layer containing titanium (Ti) and zirconium (Zr), a first electrode, and a second electrode. The first electrode and the second electrode are disposed on the opposite sides of the piezoelectric layer,. The component ratio Ti/(Zr+Ti) of the piezoelectric layer is 0.40 or more but less than 0.50. At least a portion of the piezoelectric layer formed on the first electrode contains tetragonal crystals formed by phase transition under stress caused by an underlying layer.

9 Claims, 8 Drawing Sheets

LIQUID-EJECTING HEAD, LIQUID-EJECTING APPARATUS, AND ACTUATOR

BACKGROUND

1. Technical Field

The present invention relates to a liquid-ejecting head for ejecting droplets from a nozzle in response to the deformation of a piezoelectric element, a liquid-ejecting apparatus, and an actuator that includes a piezoelectric element.

2. Related Art

A representative liquid-ejecting head is an ink jet recording head in which pressure-generating means generates pressure in a pressure-generating chamber to eject ink droplets. For example, the pressure-generating means of the ink jet recording head is a piezoelectric element in which a piezoelectric layer formed of a piezoelectric material having an electromechanical transfer function is disposed between two electrodes. The piezoelectric element is deformed to generate pressure in a pressure-generating chamber to eject ink droplets from a nozzle.

For example, the piezoelectric layer of such a piezoelectric element contains titanium (Ti) and zirconium (Zr) at an element ratio (component ratio) Zr/(Zr+Ti) in the range of 0.5 to 0.8 and is of a monoclinic system (see, for example, JP-A-2007-088446).

The piezoelectric layer may contain titanium (Ti) and zirconium (Zr) and may be of a tetragonal crystal system at a component ratio Zr/(Zr+Ti) of approximately 0.50 (see, for example, JP-A-2005-119166).

In general, it is known that the crystal system of a piezoelectric layer formed of a material having a perovskite structure, such as lead zirconium titanate (PZT), depends on the component ratio of Ti to Zr. For a piezoelectric layer formed of bulk PZT, that is, for a piezoelectric layer under no external stress and free from any restraint resulting from a substrate or the like, it is known that the crystal system of the piezoelectric layer is a tetragonal crystal system at a component ratio Ti/(Zr+Ti) of approximately 0.50 or more (a component ratio Zr/(Zr+Ti) below approximately 0.50) and a rhombohedral or monoclinic system at a component ratio Ti/(Zr+Ti) below approximately 0.50. In other words, in a piezoelectric layer formed of PZT, it is known that the morphotropic phase boundary (MPB) between the tetragonal crystal system and the rhombohedral system is in the vicinity of a component ratio Ti/(Zr+Ti) of 0.50.

The piezoelectric characteristics of a piezoelectric layer vary with the crystal system of the piezoelectric layer, as well as the composition of the piezoelectric layer. As described above, the crystal system of a piezoelectric layer of a piezoelectric element generally depends on the composition of the piezoelectric layer. Although various compositions and crystal systems, such as those disclosed in the patent documents cited above, have been proposed for a piezoelectric layer, the crystal system of the piezoelectric layer always depends on the composition of the piezoelectric layer. The composition of a piezoelectric layer can be restricted by the relationship between the lattice constant of the piezoelectric layer and the lattice constant of an underlying layer. The piezoelectric layer therefore has a limited range of compositions and a limited range of characteristics. This makes it difficult to further improve the deformation characteristics of a piezoelectric element utilizing the piezoelectric characteristics of a piezoelectric layer. Although there has been a demand for further improved deformation characteristics of a piezoelectric element in recent years, it is becoming difficult to satisfy the demand.

Such problems exist not only in piezoelectric elements for use in ink jet recording heads, but also in piezoelectric elements for use in other liquid-ejecting heads for ejecting droplets. In addition, actuators for use in devices other than liquid-ejecting heads also have the same problems.

SUMMARY

An advantage of some aspects of the invention is that it provides a liquid-ejecting head that includes a piezoelectric element having improved deformation characteristics, a liquid-ejecting apparatus, and an actuator.

According to one aspect of the invention, a liquid-ejecting head includes a flow-passage-forming substrate that includes a pressure-generating chamber, the pressure-generating chamber being in communication with a nozzle through which droplets are ejected, and a piezoelectric element disposed on the flow-passage-forming substrate, the piezoelectric element altering the internal pressure of the pressure-generating chamber, wherein the piezoelectric element includes a piezoelectric layer containing titanium (Ti) and zirconium (Zr), a first electrode, and a second electrode, the first electrode and the second electrode being disposed on the opposite sides of the piezoelectric layer, the component ratio Ti/(Zr+Ti) of the piezoelectric layer is 0.40 or more but less than 0.50, and at least a portion of the piezoelectric layer formed on the first electrode contains tetragonal crystals formed by phase transition under stress caused by an underlying layer.

Such a structure can reduce variations in the composition and crystalline orientation of the piezoelectric layer in the thickness direction, providing excellent crystallinity. Tetragonal crystals formed by phase transition under stress (tensile stress) caused by an underlying layer can improve the deformation of the piezoelectric layer because of the polarization rotation effect. These can improve the deformation characteristics, such as the degree of deformation, of the piezoelectric element.

Preferably, the piezoelectric layer includes a plurality of piezoelectric films, and at least an outermost piezoelectric film on the first electrode side contains tetragonal crystals. This can further ensure an improvement in the deformation characteristics of the piezoelectric element.

Preferably, the piezoelectric layer is formed of a material having a perovskite structure, for example, lead zirconium titanate (PZT). This can markedly improve the deformation characteristics of the piezoelectric element.

According to another aspect of the invention, a liquid-ejecting apparatus includes such a liquid-ejecting head as described above. The liquid-ejecting apparatus can have an improved ability to eject droplets.

According to still another aspect of the invention, an actuator includes a piezoelectric element, wherein the piezoelectric element includes a piezoelectric layer containing titanium (Ti) and zirconium (Zr), a first electrode, and a second electrode, the first electrode and the second electrode being disposed on the opposite sides of the piezoelectric layer, and the component ratio Ti/(Zr+Ti) of the piezoelectric layer is 0.40 or more but less than 0.50, and at least a portion of the piezoelectric layer formed on the first electrode contains tetragonal crystals formed by phase transition under stress caused by an underlying layer.

Such a structure can reduce variations in the composition and crystalline orientation of the piezoelectric layer in the thickness direction, providing excellent crystallinity. Tetragonal crystals formed by phase transition under stress (tensile stress) caused by an underlying layer can improve the deformation of the piezoelectric layer because of the polarization rotation effect. These can improve the deformation characteristics, such as the degree of deformation, of a piezoelectric element serving as an actuator.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described in detail below.

First Embodiment

Figure 1:
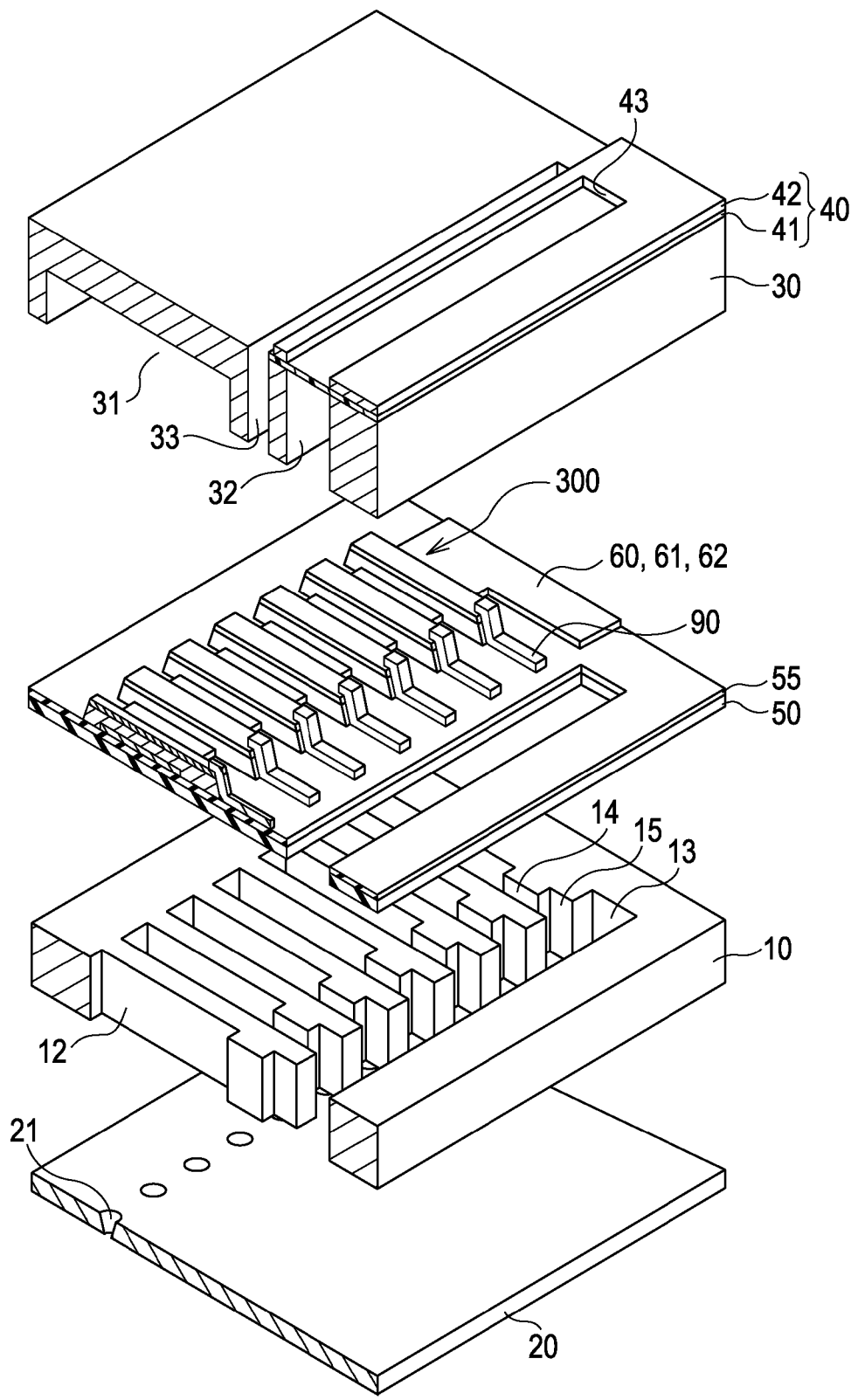
FIG. 1 is a schematic exploded perspective view of a recording head according to a first embodiment.
Figure 2A:
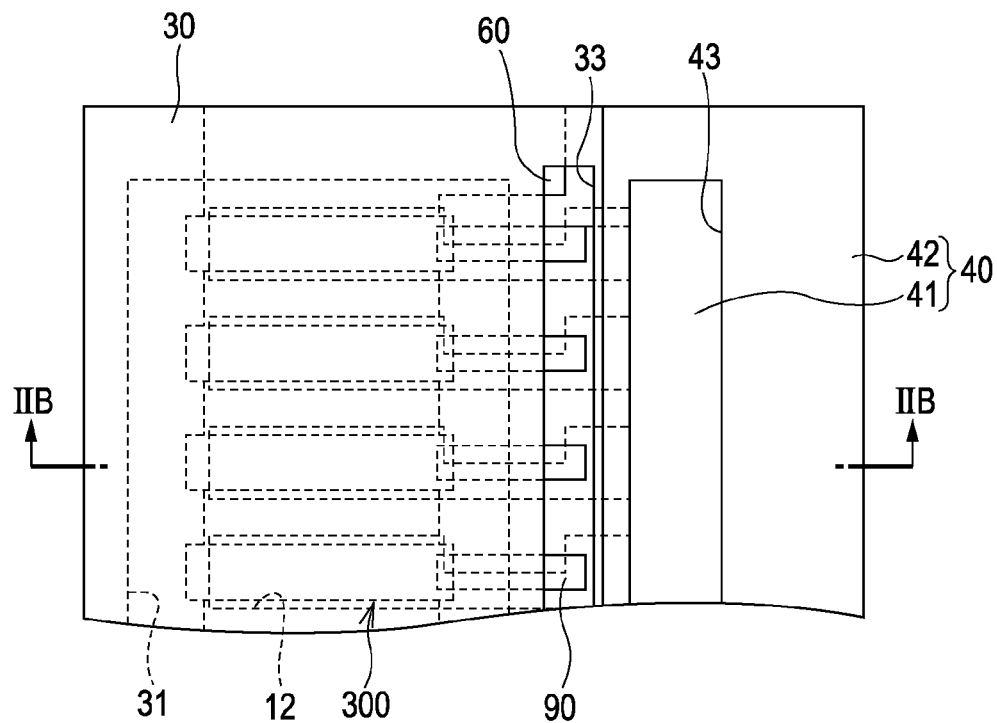
FIG. 2A is a plan view of the recording head according to the first embodiment.
Figure 2B:
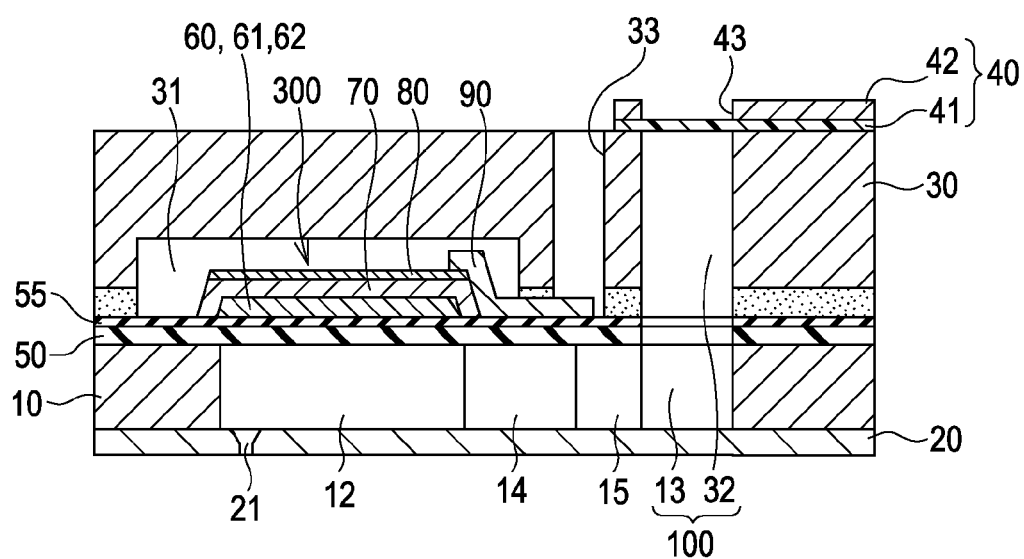
FIG. 2B is a cross-sectional view of the recording head according to the first embodiment.

FIG. 1 is an exploded perspective view of an ink jet recording head according to a first embodiment of the invention. This ink jet recording head is an example of a liquid-ejecting head. FIG. 2A is a plan view of the ink jet recording head according to the first embodiment. FIG. 2B is a cross-sectional view of the ink jet recording head taken along the line IIB-IIB of FIG. 2A.

A flow-passage-forming substrate 10 of the ink jet recording head may be a silicon single crystal substrate having a (110) orientation. As illustrated in FIGS. 1 and 2, a plurality of pressure-generating chambers 12 are juxtaposed to each other in the width direction of the flow-passage-forming substrate 10. The flow-passage-forming substrate 10 further includes a communication portion 13 outside the pressure-generating chambers 12 in the longitudinal direction. The communication portion 13 is in communication with the pressure-generating chambers 12 through corresponding ink feed channels 14 and communication paths 15. The communication portion 13 in communication with a reservoir portion 32 in a protective substrate described below constitutes part of a reservoir, which is a common ink chamber of the pressure-generating chambers 12. The ink feed channels 14 have a smaller width than the pressure-generating chambers 12, producing a constant flow resistance against ink flowing from the communication portion 13 to the pressure-generating chambers 12.

The bottom of the flow-passage-forming substrate 10 is attached to a nozzle plate 20, for example, with an adhesive or a heat seal film. The nozzle plate 20 includes nozzles 21 in communication with the corresponding pressure-generating chambers 12. The nozzle plate 20 may be formed of glass ceramic, silicon single crystals, or stainless steel.

An elastic film 50 formed of an oxide film is disposed on the top of the flow-passage-forming substrate 10 opposite the nozzle plate 20. An insulator film 55 formed of an oxide film different from the material of the elastic film 50 is formed on the elastic film 50. Piezoelectric elements 300 are disposed on the insulator film 55. Each of the piezoelectric elements 300 includes a first electrode 60, a piezoelectric layer 70, and a second electrode 80. In general, one of the first electrode 60 and the second electrode 80 serves as a common electrode of the piezoelectric elements 300, and the other electrode, together with the piezoelectric layer 70, is patterned for the individual pressure generating chambers 12 and serves as individual electrodes. While the first electrodes 60 serve as the common electrode of the piezoelectric elements 300 and the second electrodes 80 serve as the individual electrodes of the piezoelectric elements 300 in the present embodiment, for the convenience of a drive circuit or wiring, the first electrodes 60 may serve as the individual electrodes and the second electrodes 80 may serve as the common electrode.

Each of the piezoelectric elements 300 and a diaphragm constitute an actuator. The diaphragm can be deformed by the corresponding piezoelectric elements 300. Although the elastic film 50, the insulator film 55, and the first electrode 60 constitute the diaphragm in the present embodiment, the diaphragm may be composed of other components. For example, without the elastic film 50 and the insulator film 55, the first electrode 60 alone may serve as the diaphragm. Even the piezoelectric elements 300 themselves may serve as the diaphragms.

The first electrode 60 is composed of an electroconductive layer 61 and an orientation control layer 62 disposed on the electroconductive layer 61. The electroconductive layer 61 is disposed on the insulator film 55. The orientation control layer 62 may be formed of gold (Au).

The piezoelectric layer 70 may be formed of a piezoelectric material having an electromechanical transfer function. Such a piezoelectric material may be a ferroelectric material having a perovskite structure and containing Zr and/or Ti as metal, such as lead zirconium titanate (PZT), or such a ferroelectric material in combination with a metal oxide, such as niobium oxide, nickel oxide, or magnesium oxide. Examples of a ferroelectric material in combination with a metal oxide include lead zirconium titanate ($Pb(Zr,Ti)O_3$), barium zirconium titanate ($Ba(Zr,Ti)O_3$), lead lanthanum zirconate titanate (($Pb,La)(Zr,Ti)O_3$), and lead magnesium niobate zirconate titanate ($Pb(Zr,Ti)(Mg,Nb)O_3$). Such a piezoelectric layer is hereinafter referred to as a PZT-based piezoelectric layer.

At least a portion of the piezoelectric layer 70 disposed on the orientation control layer 62 has a (100) orientation under the influence of the crystalline orientation of the orientation control layer 62 formed of strontium ruthenate (SRO). More specifically, crystals grow epitaxially on the orientation control layer 62 to form a portion of the piezoelectric layer 70 having the (100) orientation.

The piezoelectric layer 70 has a component ratio Ti/(Zr+Ti) of 0.40 or more but less than 0.50 and contains tetragonal crystals. In general, it is known that a piezoelectric layer formed of a material having a perovskite structure has a tetragonal crystal system at a component ratio Ti/(Zr+Ti) of approximately 0.5 or more and a rhombohedral system at a component ratio Ti/(Zr+Ti) below approximately 0.5. Although a piezoelectric layer generally has a rhombohedral system at a component ratio Ti/(Zr+Ti) of 0.40 or more but less than 0.50, the piezoelectric layer 70 according to the present embodiment contains tetragonal crystals instead of rhombohedral crystals.

These tetragonal crystals of the piezoelectric layer 70 are formed by phase transition under stress caused by the underlying layer. The piezoelectric layer 70 is placed under a certain tensile stress caused by the underlying layer and undergoes a phase transition from rhombohedral crystals to tetragonal crystals. Thus, the piezoelectric layer 70 has a component ratio Ti/(Zr+Ti) larger than the component ratio Ti/(Zr+Ti) at a morphotropic phase boundary (MPB) under no stress caused by the underlying layer as in a bulk piezoelectric layer and mainly contains tetragonal crystals. The underlying layer of the piezoelectric layer 70 refers to layers under the piezoelectric layer 70 on the flow-passage-forming substrate 10 and includes not only the orientation control layer 62 (the first electrode 60) but also other layers, such as the insulator film 55.

In the present embodiment, an orientation control layer 62 formed of gold (Au), which has a larger lattice constant than the piezoelectric layer 70, is formed as an underlying layer. The lattice misfit between the orientation control layer 62 and the piezoelectric layer 70 causes a certain tensile stress on the piezoelectric layer 70 from the underlying layer. Gold (Au) of the orientation control layer 62 has a lattice constant of 4.07 angstroms, which is larger than the lattice constant of PZT (approximately 4.00 angstroms). Thus, the piezoelectric layer 70 is placed under a certain tensile stress caused by the orientation control layer 62 and consequently mainly contains tetragonal crystals.

The term "lattice constant", as used herein, refers to a lattice constant along an interface between the piezoelectric layer 70 and the first electrode 60 (in the direction of a- or b-axis).

Figure 3:
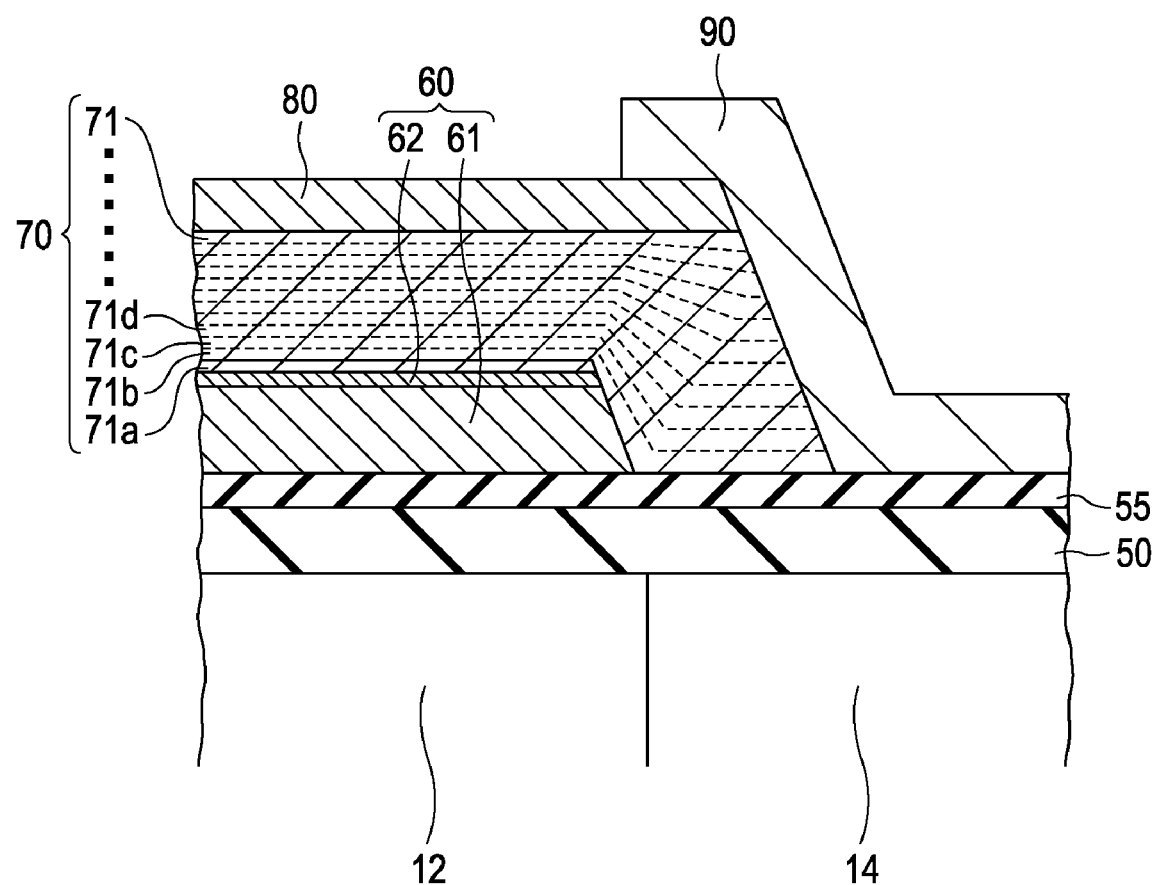
FIG. 3 is a cross-sectional view of a piezoelectric element according to the first embodiment.

As illustrated in FIG. 3, the piezoelectric layer 70 is composed of a plurality of piezoelectric films 71 (12 films in the present embodiment). Preferably, at least a piezoelectric film 71a, which is a layer closest to the first electrode 60, mainly contains tetragonal crystals. More preferably, approximately one third of the piezoelectric layer 70 in the thickness direction mainly contains tetragonal crystals. In the presence of the orientation control layer 62 formed of Au, approximately four piezoelectric films 71a to 71d on the first electrode 60 side mainly contain tetragonal crystals.

The piezoelectric layer 70 can greatly improve the deformation characteristics, such as the degree of deformation, of the piezoelectric elements 300. A component ratio Ti/(Zr+Ti) of the piezoelectric layer 70 below 0.50 can result in reduced variations in the composition and crystalline orientation of the piezoelectric layer 70 in the thickness direction, providing excellent crystallinity. Furthermore, tetragonal crystals in the piezoelectric layer 70 can increase the degree of deformation of the piezoelectric layer 70 because of the polarization rotation effect. In particular, tetragonal crystals in the outermost piezoelectric film 71a can promote the deformation of the piezoelectric layer 70. Since the piezoelectric film 71a is fixed to the orientation control layer 62, the largest tensile stress is applied to the piezoelectric film 71a in the piezoelectric layer 70. Tetragonal crystals in the piezoelectric film 71a are initially oriented in the in-plane direction (the a-axis orientation). Upon the application of an electric field, the tetragonal crystals are oriented in the thickness direction of the piezoelectric layer 70 (the c-axis orientation) because of the polarization rotation effect. The degree of deformation of the piezoelectric layer 70 is largest at the c-axis orientation. The deformation resulting from polarization rotation is generally temporary and cannot be repeated.

However, since the piezoelectric layer 70 (in particular, the piezoelectric film 71a) is placed under tensile stress caused by the underlying layer, removal of the electric field allows the rotated polarization, that is, the deformation of the piezoelectric layer 70 to return to the initial state. Thus, the deformation resulting from polarization rotation can be utilized repeatedly to increase the degree of deformation of the piezoelectric elements 300. This allows a greater number of ink droplets to be ejected and can provide a controllable ink jet recording head.

According to JP-A-2005-119166, when a piezoelectric layer has a Zr/Ti ratio in the range of 30/70 to 55/45 (a component ratio Ti/(Zr+Ti) in the range of 0.45 to 0.70), the piezoelectric layer can have a tetragonal crystal system. This possibly indicates that a piezoelectric layer having a component ratio Ti/(Zr+Ti) of 0.40 or more but less than 0.50 may contain tetragonal crystals. However, the invention is characterized by the fact that the piezoelectric layer contains tetragonal crystals formed by phase transition under stress caused by the underlying layer, rather than by the fact that the piezoelectric layer just contains tetragonal crystals. JP-A-2005-119166 does not disclose or indicate that tetragonal crystals in a piezoelectric layer can be formed by phase transition under stress caused by the underlying layer. Thus, the invention differs completely from JP-A-2005-119166.

Coming back to the description of the ink jet recording head, each of the individual electrodes of the piezoelectric elements 300, that is, each of the second electrodes 80 is connected to a lead electrode 90, for example, formed of gold (Au). The lead electrodes 90 extend onto the insulator film 55 from ends of the piezoelectric elements 300 adjacent to the ink feed channels 14.

The flow-passage-forming substrate 10 on which the piezoelectric elements 300 are formed is covered with a protective substrate 30. The protective substrate 30 includes a piezoelectric element housing space 31 for protecting the piezoelectric elements 300. The protective substrate 30 includes the reservoir portion 32. As described above, the reservoir portion 32 and the communication portion 13 in the flow-passage-forming substrate 10 constitute a reservoir 100. The reservoir 100 serves as a common ink chamber for the pressure-generating chambers 12. The protective substrate 30 further includes a through-hole 33 in the thickness direction. The ends of the lead electrodes 90 extending from the piezoelectric elements 300 are exposed in the through-hole 33.

The protective substrate 30 is attached to a compliance substrate 40. The compliance substrate 40 includes a sealing film 41 and a fixing sheet 42. The sealing film 41 is formed of a flexible material and seals one side of the reservoir portion 32. The fixing sheet 42 is formed of a relatively hard material. The fixing sheet 42 has an opening 43 on top of the reservoir 100. Thus, one side of the reservoir 100 is sealed with the flexible sealing film 41 alone.

In the ink jet recording head according to the present embodiment, the reservoir 100 to the nozzles 21 are filled with ink supplied from an ink inlet connected to an external ink supply unit (not shown). A voltage is applied to each of the piezoelectric elements 300 in response to recording signals from a drive circuit (not shown) to deform the individual piezoelectric elements 300. The deformation increases the internal pressure of the corresponding pressure-generating chambers 12, allowing the ink jet recording head to eject ink droplets from the corresponding nozzles 21.

A method for manufacturing an ink jet recording head, more specifically, a method for manufacturing piezoelectric elements 300 constituting an actuator will be described below. FIGS. 4 to 6 are cross-sectional views illustrating a method for manufacturing the ink jet recording head according to the first embodiment of the invention.

Figure 4A:
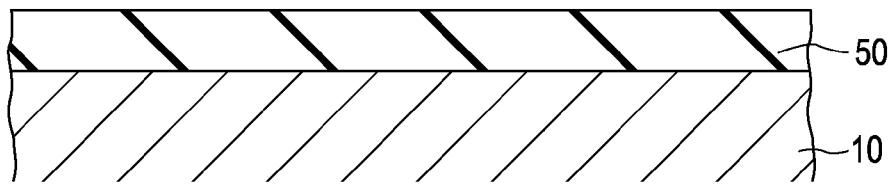
FIGS. 4A to 4C are cross-sectional views illustrating a method for manufacturing the recording head according to the first embodiment.
Figure 4B:
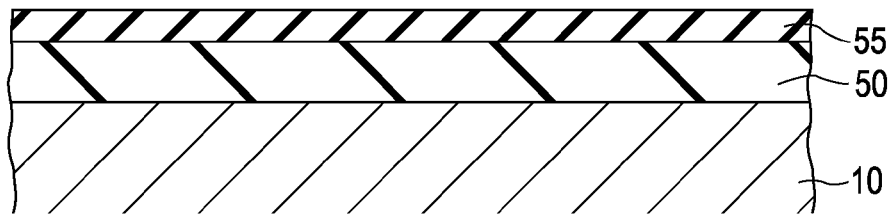
Figure 4C:
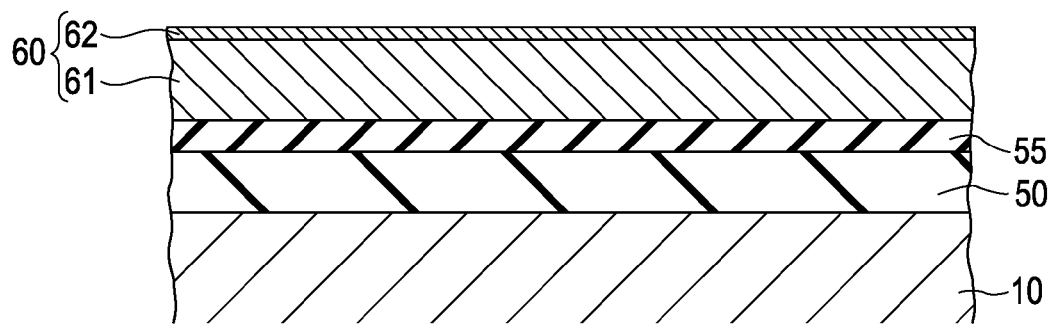

As illustrated in FIG. 4A, first, the flow-passage-forming substrate 10, which may be a silicon substrate, is thermally oxidized to form the elastic film 50 formed of silicon dioxide ($SiO_2$) on the flow-passage-forming substrate 10. As illustrated in FIG. 4B, an insulator film 55 having a thickness in the range of approximately 100 to 500 nm and formed of zirconium oxide is formed on the elastic film 50. As illustrated in FIG. 4C, the first electrode 60 is formed on the insulator film 55. More specifically, an electroconductive layer 61 having a thickness in the range of approximately 20 to 80 nm and formed of platinum (Pt) and/or iridium (Ir) is formed on the insulator film 55, for example, by sputtering. An orientation control layer 62 having a thickness in the range of approximately 5 to 20 nm and formed of gold (Au) is formed on the electroconductive layer 61, for example, by sputtering. The orientation control layer 62 also serves as an electrode. Although the first electrode 60 is composed of the electroconductive layer 61 and the orientation control layer 62 in the present embodiment, the first electrode 60 may be only composed of the orientation control layer 62 formed of gold (Au). Gold (Au) may be suitably replaced by silver (Ag), which has a cubic close-packed structure and a lattice constant of 4.078 angstroms. Strontium ruthenate (SRO) having a lattice constant of 4.01 angstroms also has an effect on the phase transition of a PZT-based piezoelectric layer.

The piezoelectric layer 70 is then formed by a sol-gel method in the following manner. First, an organometallic compound is dissolved or dispersed in a solvent to prepare a sol. The sol is applied to the first electrode 60, is dried for gelation, and is fired at a high temperature to form the piezoelectric layer 70 formed of a metal oxide. The method for manufacturing the piezoelectric layer 70 is not limited to the sol-gel method and may be a metal-organic decomposition (MOD) method or a sputtering method.

Figure 5A:
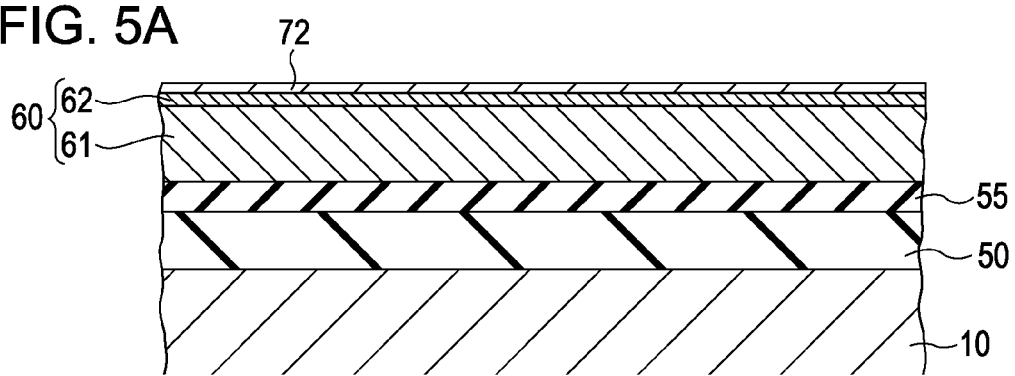
FIGS. 5A to 5d are cross-sectional views illustrating a method for manufacturing the recording head according to the first embodiment.

More specifically, the piezoelectric layer 70 is formed in the following manner. First, as illustrated in FIG. 5A, a piezoelectric precursor film 72, which is a precursor film of the piezoelectric layer 70, is formed on the first electrode 60. More specifically, a sol (solution) containing Ti and Zr is applied to the orientation control layer 62 (a coating process). The piezoelectric precursor film 72 is then heated at a predetermined temperature for a predetermined period of time for drying (a drying process). For example, the piezoelectric precursor film 72 is dried at a temperature in the range of 150° C. to 170° C. for 5 to 10 minutes. The dried piezoelectric precursor film 72 is then heated at a predetermined temperature for a predetermined period of time for degreasing (a degreasing process). For example, the piezoelectric precursor film 72 is degreased at a temperature in the range of approximately 300° C. to 400° C. for approximately 5 to 10 minutes. The term "degreasing", as used herein, means that organic components contained in the piezoelectric precursor film 72 are removed as $NO_2$, $CO_2$, and/or $H_2O$, for example. Preferably, the heating rate in the degreasing process is at least 15° C./s.

Figure 5B:
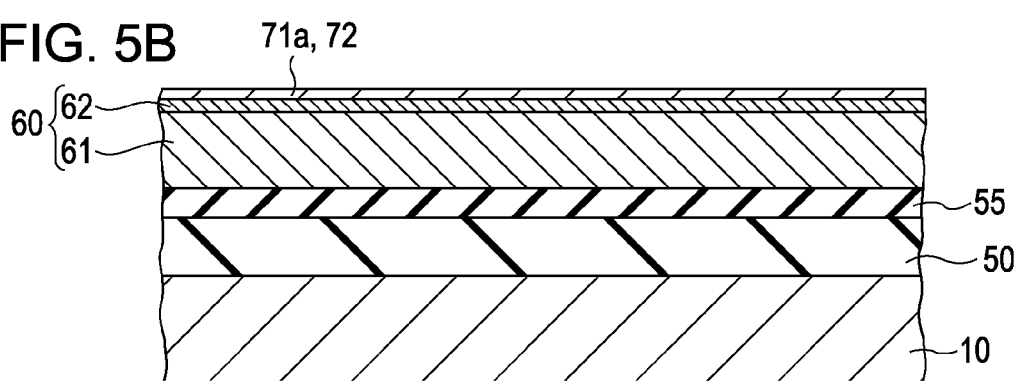

As illustrated in FIG. 5B, the piezoelectric precursor film 72 is then heated at a predetermined temperature for a predetermined period of time for crystallization, forming the first layer, that is, the piezoelectric film 71a (a firing process). More specifically, for example, the piezoelectric precursor film 72 is heated at a temperature in the range of 650° C. to 800° C. for 5 to 30 minutes to form the piezoelectric film 71a. Preferably, the heating rate in the firing process is 15° C./s or less.

Figure 5C:
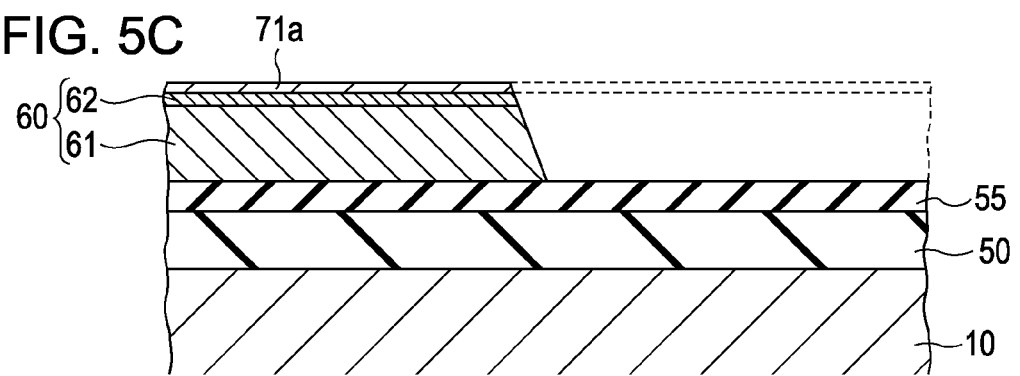
Figure 5D:
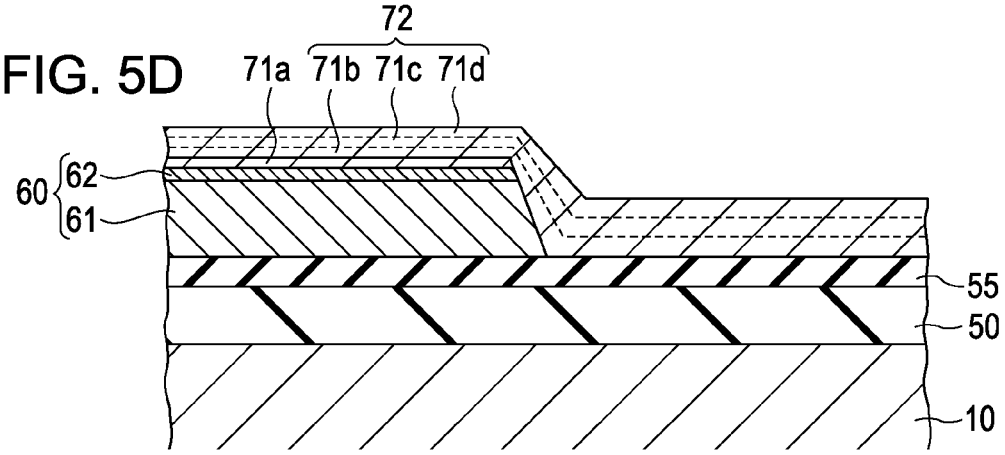

As illustrated in FIG. 5C, the first electrode 60 and the piezoelectric film 71a are then simultaneously patterned in a predetermined shape. As illustrated in FIG. 5D, the coating process, the drying process, and the degreasing process are performed predetermined times to form the second to fourth piezoelectric precursor films 72 on the piezoelectric film 71a and the flow-passage-forming substrate 10. These piezoelectric precursor films 72 are simultaneously heated for crystallization, forming piezoelectric films 71b to 71d (a firing process). The process of forming a plurality of piezoelectric precursor films 72 and the process of crystallizing the plurality of piezoelectric precursor films 72 are performed predetermined times to form the piezoelectric layer 70 composed of a plurality of piezoelectric films 71 (12 layers in the present embodiment).

The lattice misfit between the piezoelectric layer 70 and the underlying orientation control layer 62 causes a certain tensile stress on the piezoelectric layer 70 from the orientation control layer 62. The tensile stress allows the piezoelectric layer 70 to contain tetragonal crystals even at a component ratio Ti/(Zr+Ti) of 0.40 or more but less than 0.50. The tensile stress applied to the piezoelectric layer 70 can be controlled by the selection of the material of the orientation control layer 62. Examples of the material of the orientation control layer 62 include gold, silver, zirconium (Zr), and chromium (Cr). Under the influence of the crystalline orientation of an orientation control layer 62 formed of Zr or Cr, the piezoelectric layer 70 has a (111) orientation.

Figure 6A:
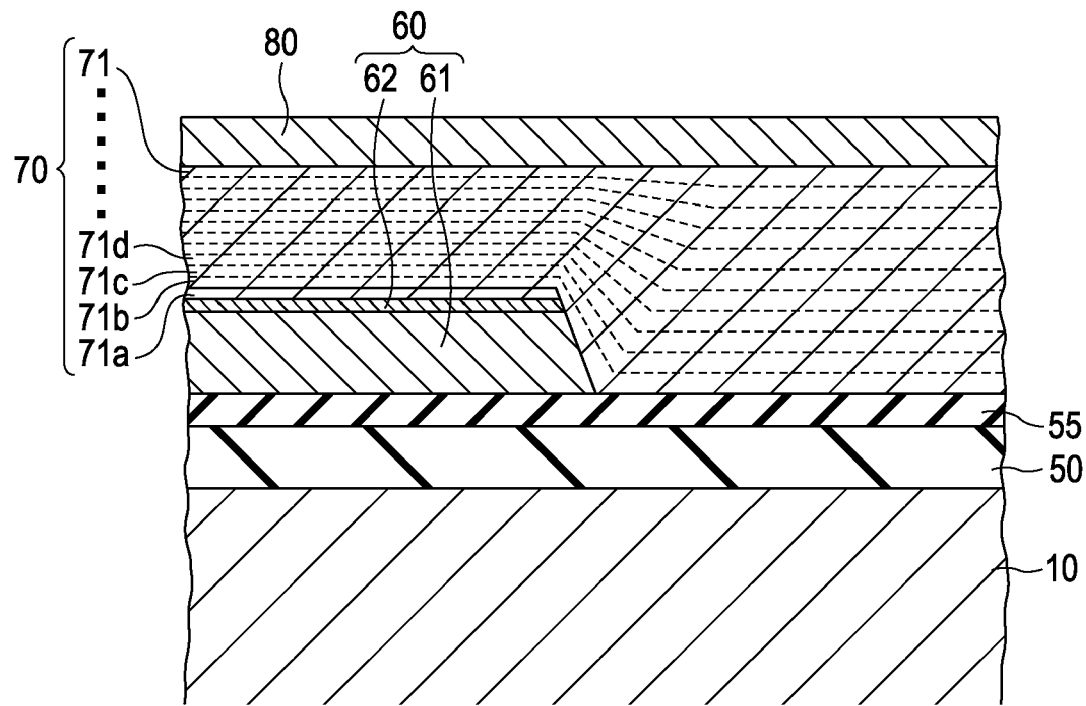
FIGS. 6A and 6B are cross-sectional views illustrating a method for manufacturing the recording head according to the first embodiment.
Figure 6B:
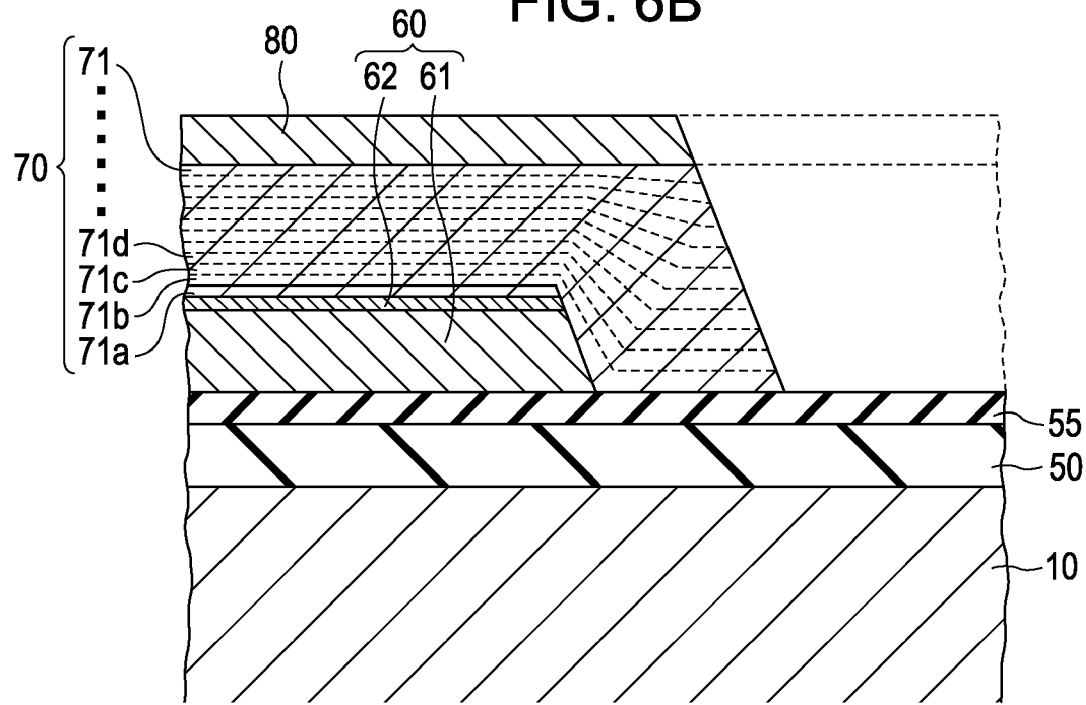

As illustrated in FIG. 6A, the second electrode 80, for example, formed of iridium (Ir) is formed on the piezoelectric layer 70. As illustrated in FIG. 6B, the piezoelectric layer 70 and the second electrode 80 are patterned to the corresponding pressure-generating chamber 12. Through these processes, the piezoelectric elements 300 are manufactured.

In the present embodiment, the lattice misfit between the orientation control layer 62 and the piezoelectric layer 70 causes a tensile stress on the piezoelectric layer 70 from the orientation control layer 62. Alternatively, the underlying layer, such as the first electrode 60 and/or the insulator film 55, may be formed of a material having a smaller coefficient of linear expansion than the piezoelectric layer 70. In this case, during a cooling process after firing of the piezoelectric layer 70, the piezoelectric layer 70 is placed under a certain tensile stress caused by the underlying layer. In the manufacture of the piezoelectric elements 300, therefore, the material and thickness of the underlying layer of the piezoelectric layer 70, such as the first electrode 60 and/or the insulator film 55, the composition of the piezoelectric layer 70, and manufacturing conditions, such as firing temperature, may be appropriately altered to control the tensile stress applied to the piezoelectric layer 70 from the underlying layer. When the tensile stress applied to the piezoelectric layer 70 from the underlying layer is appropriately controlled, the piezoelectric layer 70 can contain tetragonal crystals even at a component ratio Ti/(Zr+Ti) of 0.40 or more but less than 0.50.

Figure 7:
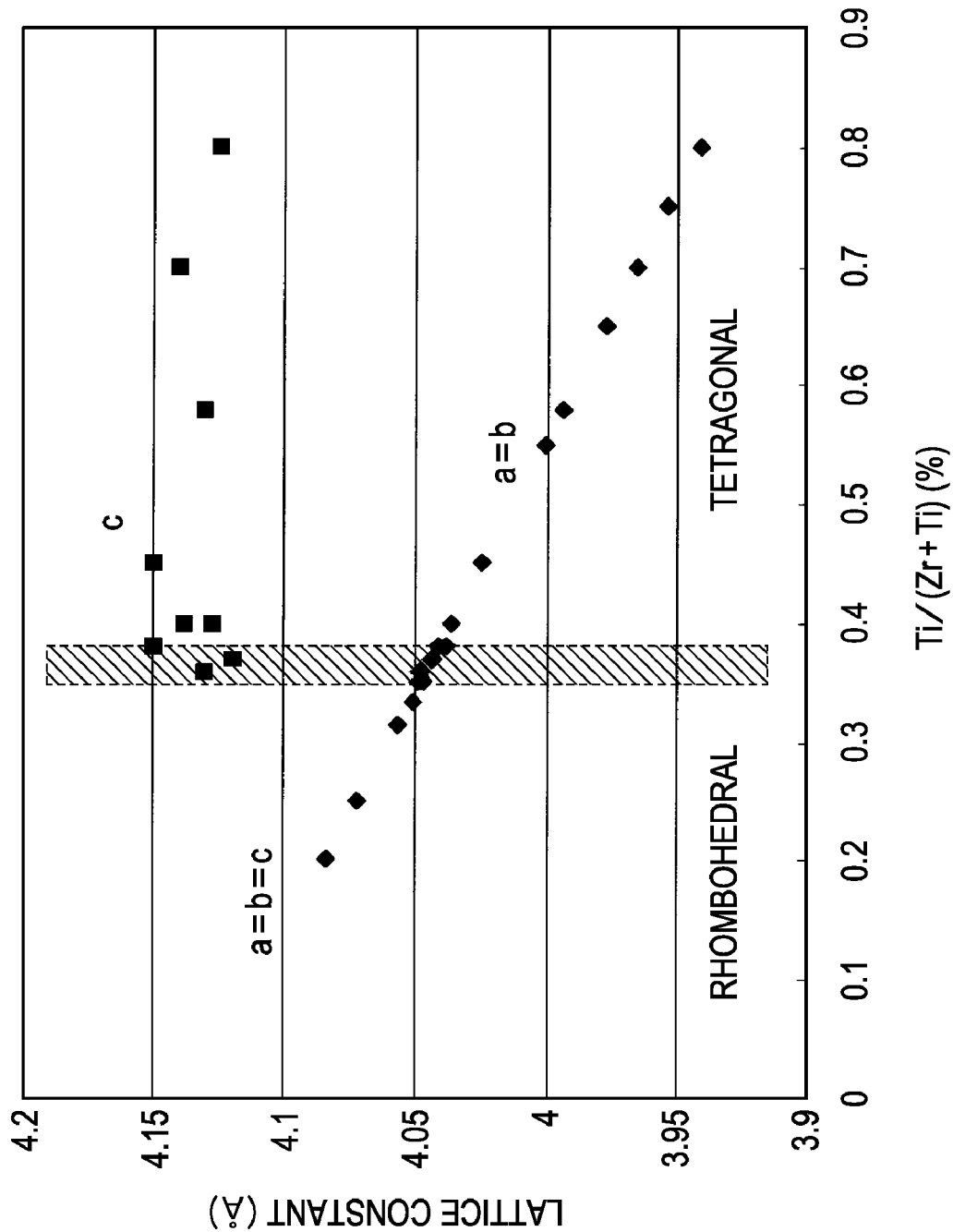
FIG. 7 is a graph showing the relationship between the component ratio Ti/(Zr+Ti) and the lattice constant of a piezoelectric layer.

The following describes variations in the lattice constant of the piezoelectric layer 70 manufactured under constant conditions except that the component ratio Ti/(Zr+Ti) is altered. FIG. 7 is a graph showing the relationship between the component ratio Ti/(Zr+Ti) and the lattice constant of the piezoelectric layer.

The lattice constant of the piezoelectric layer is determined by out-of-plane and in-plane X-ray diffraction (XRD) measurements. The piezoelectric layer 70 is formed in the following manner. First, an insulator film 55, for example, formed of zirconium oxide and having a thickness of approximately 300 nm is formed on a substrate. Platinum (Pt) and iridium (Ir) are then deposited on the insulator film 55 in this order by sputtering to form an electroconductive layer 61. The electroconductive layer 61 has a film thickness of Ir/Pt=10/50 nm. An orientation control layer 62 formed of gold (Au) and having a thickness of approximately 10 nm is formed on the electroconductive layer 61 by ion-beam-assisted sputtering. The resulting gold crystals have a (100) orientation in the thickness direction. A sol containing an organometallic compound dissolved or dispersed in a solvent is applied to the orientation control layer 62, is dried, is allowed for gelation at 400° C., and is fired at 750° C. by rapid thermal annealing (RTA), thus forming a piezoelectric layer 70 formed of a metal oxide.

As illustrated in FIG. 7, the a-axis, b-axis, and c-axis lattice constants are substantially the same (a=b=c) at a component ratio Ti/(Zr+Ti) of the piezoelectric layer 70 below approximately 0.40. The c-axis lattice constant differs from the a-axis and b-axis lattice constants (a=b<c) at a component ratio Ti/(Zr+Ti) of approximately 0.40 or more. These results show that the piezoelectric layer 70 mainly contains rhombohedral crystals at a component ratio Ti/(Zr+Ti) of the piezoelectric layer 70 below approximately 0.40 and tetragonal crystals at a component ratio Ti/(Zr+Ti) of approximately 0.40 or more. Thus, the tensile stress applied to the piezoelectric layer 70 from the underlying layer can be controlled to form a piezoelectric layer 70 having a component ratio Ti/(Zr+Ti) of 0.40 or more but less than 0.50 and mainly containing tetragonal crystals.

Other Embodiments

Although an embodiment of the invention has been described, the invention is not limited to this embodiment. For example, the piezoelectric layer 70 is placed under the tensile stress caused by the orientation control layer 62 of the first electrode 60 in the first embodiment. However, if the material of the electroconductive layer 61 of the first electrode 60 or the insulator film 55 or manufacturing conditions can be altered such that the piezoelectric layer 70 is placed under a desired tensile stress, the orientation control layer 62 may be omitted. Furthermore, another layer may be formed between the insulator film 55 and the first electrode 60 to control the tensile stress applied to the piezoelectric layer 70.

Although the flow-passage-forming substrate 10 is a silicon single crystal substrate in the first embodiment, the material of the flow-passage-forming substrate 10 may be appropriately determined in consideration of the stress applied to the piezoelectric layer 70 and may be silicon on insulator (SOI) or glass.

Figure 8:
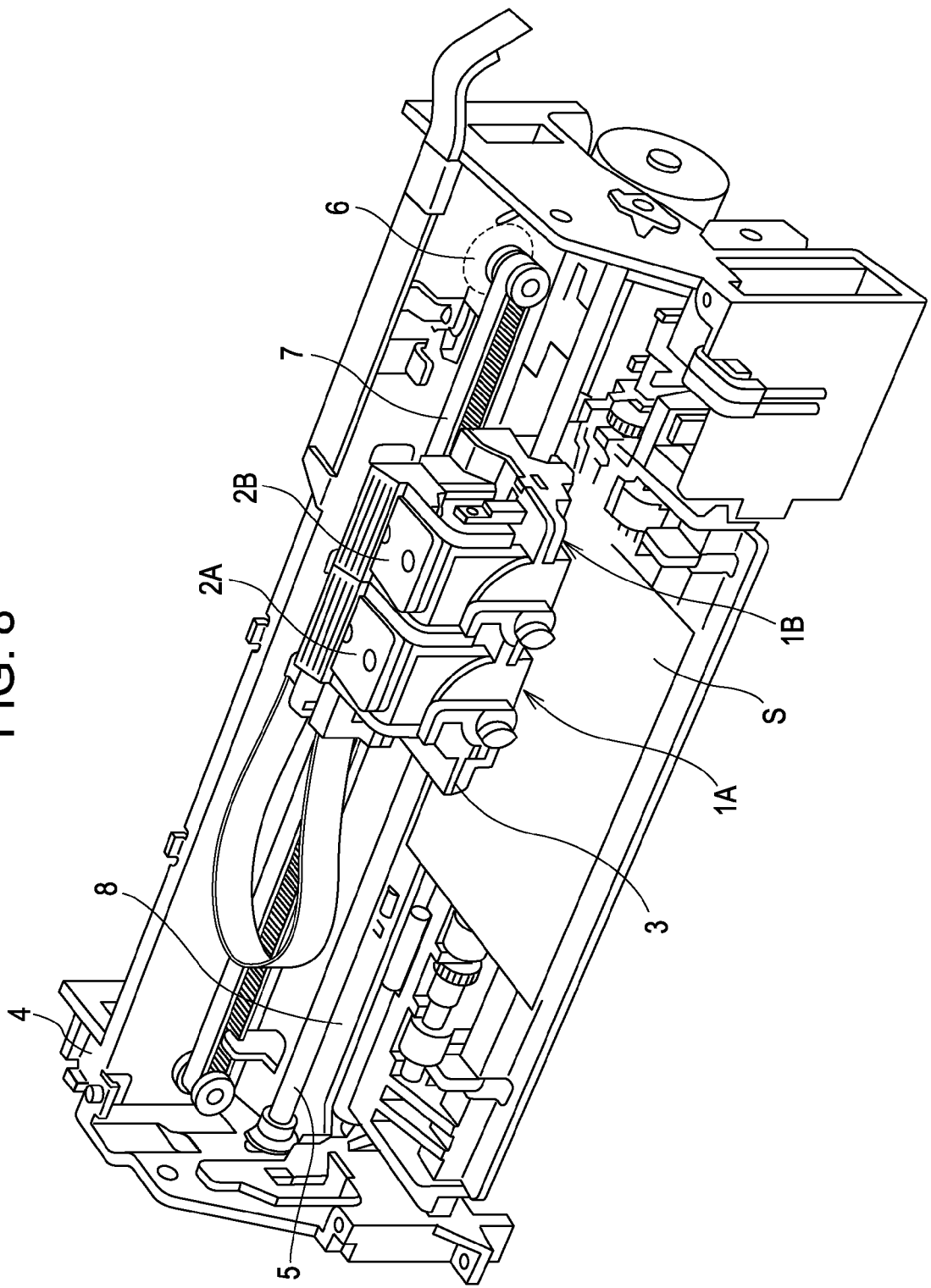
FIG. 8 is a schematic view of a recording apparatus according to an embodiment of the present invention.

The ink jet recording head described above can be installed in an ink jet recording apparatus as one component of a recording head unit that includes an ink path in communication with an ink cartridge. As illustrated in FIG. 8, recording head units 1A and 1B include an ink jet recording head and house removable cartridges 2A and 2B. The cartridges 2A and 2B constitute an ink supply unit. A carriage 3 includes the recording head units 1A and 1B and is mounted on a carriage shaft 5 attached to a main body 4 of the recording apparatus. The carriage 3 can move in the axial direction. For example, the recording head units 1A and 1B eject a black ink composition and a color ink composition, respectively.

When the driving force of a drive motor 6 is transferred to the carriage 3 via a plurality of gears (not shown) and a timing belt 7, the carriage 3 including the recording head units 1A and 1B is moved along the carriage shaft 5. The main body 4 of the recording apparatus includes a platen 8 along the carriage shaft 5. A recording sheet S, which is a recording medium, such as paper, fed by a feed roller (not shown) can be transported over the platen 8.

Although the ink jet recording head and the liquid-ejecting apparatus have been described as examples of a liquid-ejecting head and a liquid-ejecting apparatus in the embodiments described above, the invention is directed to a wide variety of general liquid-ejecting heads and liquid-ejecting apparatuses including the liquid-ejecting heads. As a matter of course, the invention can be applied to liquid-ejecting heads for ejecting liquid other than ink. Examples of other liquid-ejecting heads include recording heads for use in image recorders, such as printers, coloring material ejecting heads for use in the manufacture of color filters for liquid crystal displays, electrode material ejecting heads for use in the formation of electrodes for organic EL displays and field-emission displays (FED), and bioorganic compound ejecting heads for use in the manufacture of biochips.

The invention can be applied not only to liquid-ejecting heads, such as ink jet recording heads, but also to actuators installed in other apparatuses.

What is claimed is:

1. A liquid-ejecting head comprising:
    a flow-passage-forming substrate that includes a pressure-generating chamber, the pressure-generating chamber being in communication with a nozzle through which droplets are ejected;
    a piezoelectric element disposed on the flow-passage-forming substrate, the piezoelectric element altering the internal pressure of the pressure-generating chamber, wherein:
    the piezoelectric element includes a piezoelectric layer containing titanium (Ti) and zirconium (Zr), a first electrode, and a second electrode, the first electrode and the second electrode being disposed on the opposite sides of the piezoelectric layer; and
    an underlying layer configured to establish a tensile stress in the piezoelectric layer, wherein the component ratio Ti/(Zr+Ti) of the piezoelectric layer is 0.40 or more but less than 0.50, and at least a portion of the piezoelectric layer formed on the first electrode contains tetragonal crystals formed by phase transition under the tensile stress caused by the underlying layer.

2. The liquid-ejecting head according to claim 1, wherein the piezoelectric layer includes a plurality of piezoelectric films, and at least an outermost piezoelectric film on the first electrode side contains tetragonal crystals.

3. The liquid-ejecting head according to claim 1, wherein the piezoelectric layer is formed of a material having a perovskite structure.

4. The liquid-ejecting head according to claim 3, wherein the piezoelectric layer is formed of lead zirconium titanate (PZT).

5. A liquid-ejecting apparatus comprising:
    a liquid-ejecting head that includes:
    a flow-passage-forming substrate that includes a pressure-generating chamber, the pressure-generating chamber being in communication with a nozzle through which droplets are ejected;
    a piezoelectric element disposed on the flow-passage-forming substrate, the piezoelectric element altering the internal pressure of the pressure-generating chamber, wherein:
    the piezoelectric element includes a piezoelectric layer containing titanium (Ti) and zirconium (Zr), a first electrode, and a second electrode, the first electrode and the second electrode being disposed on the opposite sides of the piezoelectric layer;

an underlying layer configured to establish a tensile stress in the piezoelectric layer, wherein the component ratio Ti/(Zr+Ti) of the piezoelectric layer is 0.40 or more but less than 0.50, and at least a portion of the piezoelectric layer formed on the first electrode contains tetragonal crystals formed by phase transition under the tensile stress caused by the underlying layer.

6. The liquid-ejecting apparatus according to claim 5, wherein the piezoelectric layer includes a plurality of piezoelectric films, and at least an outermost piezoelectric film on the first electrode side contains tetragonal crystals.

7. The liquid-ejecting apparatus according to claim 5, wherein the piezoelectric layer is formed of a material having a perovskite structure.

8. The liquid-ejecting apparatus according to claim 7, wherein the piezoelectric layer is formed of lead zirconium titanate (PZT).

9. An actuator comprising:

a piezoelectric element, wherein the piezoelectric element includes a piezoelectric layer containing titanium (Ti) and zirconium (Zr), a first electrode, and a second electrode, the first electrode and the second electrode being disposed on the opposite sides of the piezoelectric layer, and an underlying layer configured to establish a tensile stress in the piezoelectric layer, wherein the component ratio Ti/(Zr+Ti) of the piezoelectric layer is 0.40 or more but less than 0.50, and at least a portion of the piezoelectric layer formed on the first electrode contains tetragonal crystals formed by phase transition under the tensile stress caused by the underlying layer.

* * * * *